United States Patent [19]

Deaver et al.

[11] Patent Number: 4,755,887
[45] Date of Patent: Jul. 5, 1988

[54] TRIGGERING FOR WAVEFORM RECORDING

[75] Inventors: Phillip E. Deaver, Cupertino; Stephen K. Will, Sunnyvale; Steven C. Bird, San Jose; Mark S. Allen, Saratoga, all of Calif.

[73] Assignee: Hewlett-Packard Company, Palo Alto, Calif.

[21] Appl. No.: 925,346

[22] Filed: Oct. 31, 1986

[51] Int. Cl.[4] .......................... G11B 5/00; G11B 31/00
[52] U.S. Cl. ............................................ 360/5; 369/19
[58] Field of Search ................... 360/5, 6, 7, 69, 61; 369/19

[56] References Cited

U.S. PATENT DOCUMENTS

| | | | |
|---|---|---|---|
| 3,864,731 | 2/1975 | Callahan | 360/5 |
| 4,132,226 | 1/1979 | Seeley et al. | 360/7 |
| 4,558,379 | 12/1985 | Hutter et al. | 360/6 |

Primary Examiner—Vincent P. Canney
Attorney, Agent, or Firm—James M. Williams

[57] ABSTRACT

A drop out trigger captures waveform data when a normally continuous input signal is disrupted or interrupted. In the preferred embodiment, a conventional trigger detects a parameter periodically satisfied by the continuous signal and resets a timer whenever a trigger event occurs. The alarm count of the timer is set for an interval slightly larger than the periodic interval. If the timer reaches the alarm count, a measurement signal is generated.

2 Claims, 4 Drawing Sheets

TRIGGERING FOR WAVEFORM RECORDING

BACKGROUND AND SUMMARY OF THE INVENTION

The invention relates to waveform recorders and in particular to a means and method for triggering a waveform recorder upon the disruption or interruption of a normally continuous signal.

Waveform recorders are general purpose, time domain measuring instruments that take samples of analog waveforms and store the sample values as digital data suitable for analysis by a computer. Waveform recorders are generally suited to measurement of both transient or single-shot waveforms and continuous or repetitive waveforms. Waveform recorders typically acquire a large amount of data over a short period of time to capture a representative sample of a repetitive waveform or to record the occurrence of a single-shot event.

Since the waveform is captured in a digital memory, all digital waveform recorders have some type of pretrigger. Typically, the memory records data continuously in a circular configuration, recording new data over existing data until the trigger stops the recording. An adjustable delay may be used after the trigger to change the time frame of the data captured. For example, with zero delay, the recorder will capture waveform data that occurred before the trigger event, so the cause of the trigger event can be investigated. With a delay equal to the duration that can be stored in the memory, the captured data will start at the trigger event. With longer delays, data at some time after the trigger event can be captured.

One of the most important aspects in designing a digital waveform recorder is to trigger accurately and properly. Converting the data to digital form has made setting the trigger level both accurate and repeatable. The gintroduction of hysteresis trigger controls, which vary the width of the band that the signal must go through before a trigger can occur, has made it possible to trigger reliably on small signals or on large signals with large amounts of noise. However, all triggers have required the occurrence of an event in which the signal crosses the preset trigger level. Thus it has been difficult to record waveforms that are characterized by the non-occurrence of an expected event, where a normally active signal becomes inactive or altered, because there has been no way to automatically trigger on such a non-event.

The area of computer disc testing has made clear the limitations and the disadvantages of conventional triggering techniques. The electromechanical analysis of the head positioning servo system, the read/write electronics and the magnetic material on the disc requires a search for and isolation of infrequent errors and imperfections. An error is characterized by a "drop out", a missing pulse in an otherwise continuous string. In the past, these dropouts were located by testing a checkword at the end of each sector of the disc. An error condition in the checkword was a pretrigger for recording the signal from the defective sector—256 bytes. Then the recorded data was sent to a computer and a pattern recognition routine run to locate the error.

In many other measurement situations a "drop out" trigger would make waveform recording possible or at least greatly simplify the procedure. In industrial power distribution, a device with high in-rush current can cause a temporary drop in line voltage, adversely affecting other devices on the same main, especially computers. It has been difficult or impossible to capture such a disruption of a continuous signal with conventional triggers. However, a drop out trigger could trigger on the drop in line voltage for one cycle, allowing the events surrounding the line voltage drop to be captured and studied. Carrier loss or distortion in communication systems, and sync loss or distortion in video transmission systems could similarly be captured using a waveform recorder equipped with a drop out trigger.

The invention provides means and a method for achieving a "drop out" trigger function. According to a preferred embodiment in accordance to the invention, the drop out trigger is realized by adding a timer circuit to a conventional trigger detection circuit. The timer monitors the elapsed time between trigger events. The conventional trigger detects a parameter periodically satisfied by the continuous signal and resets a timer whenever a trigger event occurs. The alarm count of the timer is set for an interval slightly larger than the periodic interval. Whenever a trigger event occurs, the timer gets reset. If the timer reaches the alarm count, a measurement signal is generated which can be used to stop the measurement and view the waveform or to begin another countdown timer interval.

DETAILED DESCRIPTION OF THE INVENTION

Figure 1:
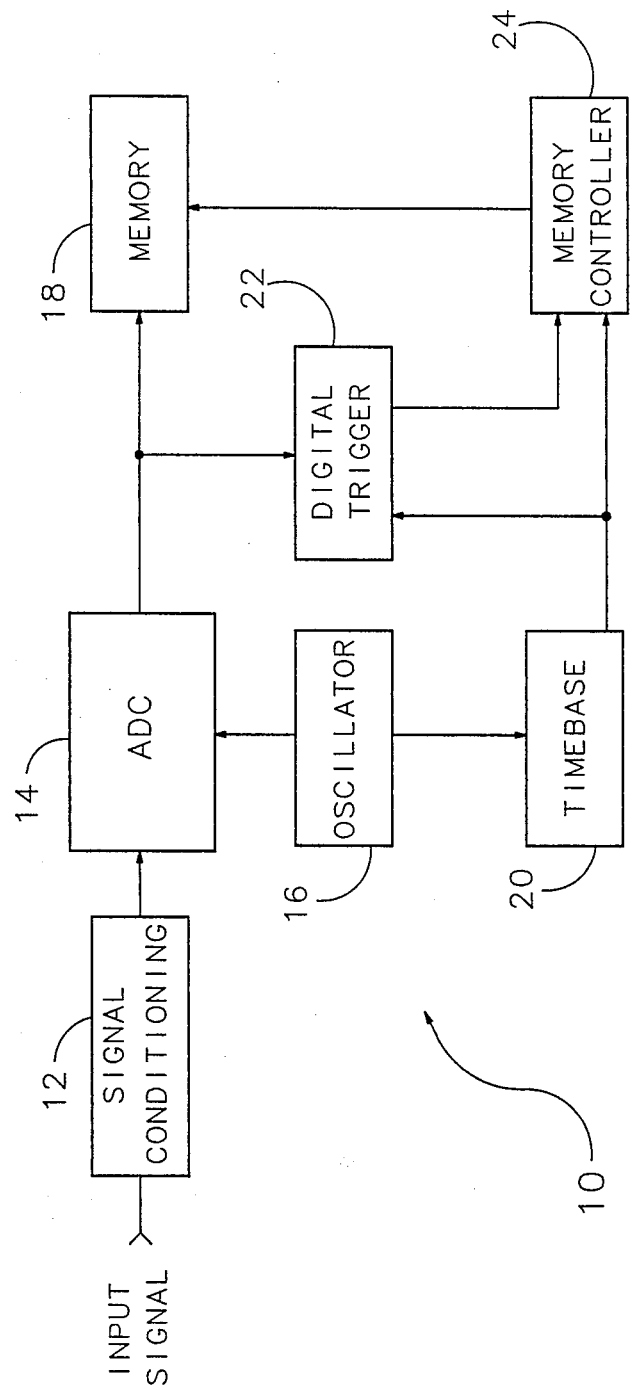
FIG. 1 is a schematic block diagram of a waveform recorder which incorporates a trigger circuit constructed in accordance with the invention.

FIG. 1 shows a schematic diagram of the elements of a waveform recorder 10 which incorporates the trigger circuit of the invention. Input signals for recorder 10 are applied to signal conditioning circuitry 12, which can include multiple sensitivity ranges and high impedance circuits. The input signals then pass to an analog to digital converter (ADC) 14 which transforms the analog input signals into digital form for storage in memory 18. Memory 18 records the digital signal data continuously in a circular configuration, so that when the memory is filled, the entering data is written over the data already stored. Memory 18 is generally rather small and fast, on the order of 16K–256K words, thus depending on the sampling rate, only data for a short time interval can be captured.

In order to capture the data for a particular event of interest, trigger 22 is programmed to produce a trigger signal on the occurrence of some aspect of the input waveform that is characteristic of the event to be captured. In response to the signal from trigger 22, memory controller 24 stops the flow of data into memory 18, so the memory holds the last iteration of data written into memory, which is the data from the event of interest. Depending on the delay from the trigger signal to the stop writing command, data prior to, subsequent to, or surrounding the trigger event will be captured.

Oscillator 16 generates a clock signal for controlling the sampling interval of ADC 14 and for use by timebase 20 to produce clock signals for trigger 22 and for memory controller 24.

Triggering

The waveform recorder 10 has a variety of conventional triggering modes, based on the amplitude or the slope of the input waveform. For example, by using hysteresis bands, the trigger can be set to occur when the input signal crosses a threshold voltage in a positive direction, a negative direction, or either direction. Alternatively, by not using hysteresis bands, the trigger can be set to occur when the slope of the input signal goes above a certain programmable threshold value or below a programmable threshold certain value. The hysteresis bands reduce sensitivity to noise. The drop out trigger of the invention can be used in conjunction with any of these conventional trigger modes in the implementation of FIG. 1.

Figure 2:
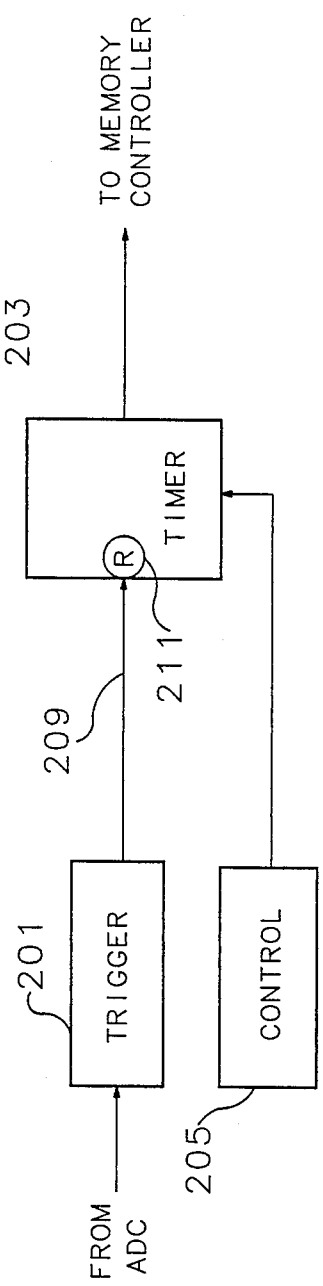
FIG. 2 is a schematic diagram of the preferred embodiment of a trigger circuit in accordance with the invention.

In its most basic form, the dropout trigger is comprised of a conventional trigger circuit 201, a reset timer 203, and a control circuit 205, configured as shown in FIG. 2. The conventional trigger 201 produces an output pulse on line 209 each time the input signal satisfies the selected trigger condition. These trigger output pulses are applied to the reset terminal 211 of timer 203, so that the timer is reset every time the input signal satisfies the trigger condition. Thus, the timer 203 monitors the time between trigger events. Control circuit 205 sets the timer alarm count, i.e., the length of time until the timer count will overflow. If the timer reaches the predetermined alarm count set by control 205, the drop out trigger generates a "trigger ocurred" signal that is sent to the memory controller. The memory controller then stops the measurement after the appropriate post-trigger delay period.

Figure 3:
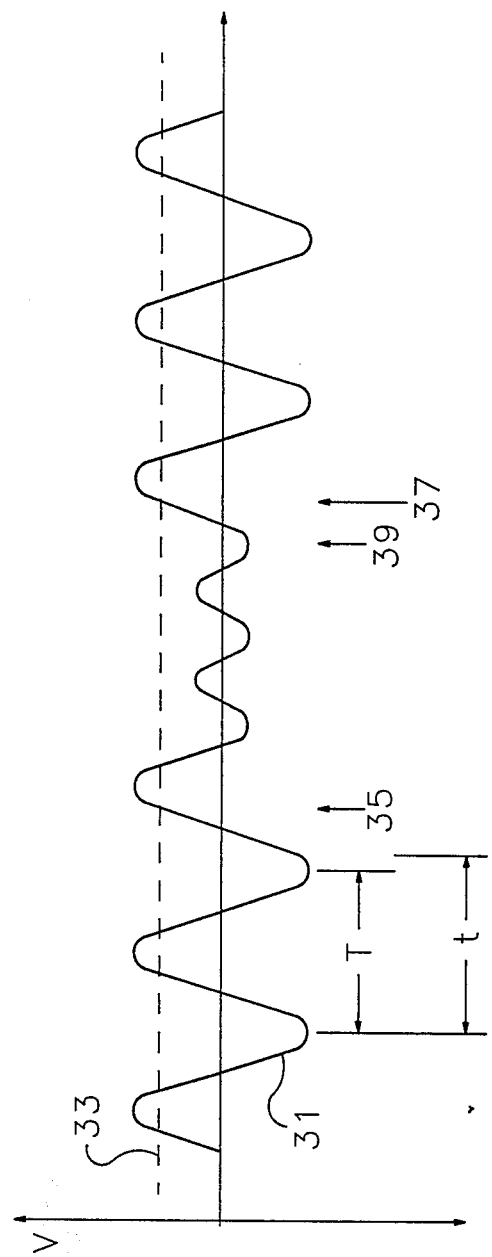
FIG. 3 is a graph of a waveform illustrating the operation of the trigger circuit of FIG. 2.

The operation of the dropout trigger shown in FIG. 2 is illustrated in FIG. 3. The drop out trigger is configured to detect and capture any disruption of normally continuous signal 31. The threshold level 33 of trigger 201 is set just below the expected peak amplitude of signal 31 and trigger 201 is set to produce an output pulse when signal 33 goes through threshold 31 in the positive direction. The alarm count of the timer 203 is set to an interval t slightly longer than the period T of signal 31.

As long as the amplitude and the frequency of signal 31 remain constant, trigger 201 will reset timer 203 before the alarm count is reached, and the drop out trigger will not produce a measurement signal. However, if the amplitude of signal 31 decreases and the signal does not cross the threshold level for one or more cycles, as between trigger points 35 and 37, timer 203 reaches the alarm count after time t and produces a "trigger occurred" signal, as at point 39.

Figure 4:
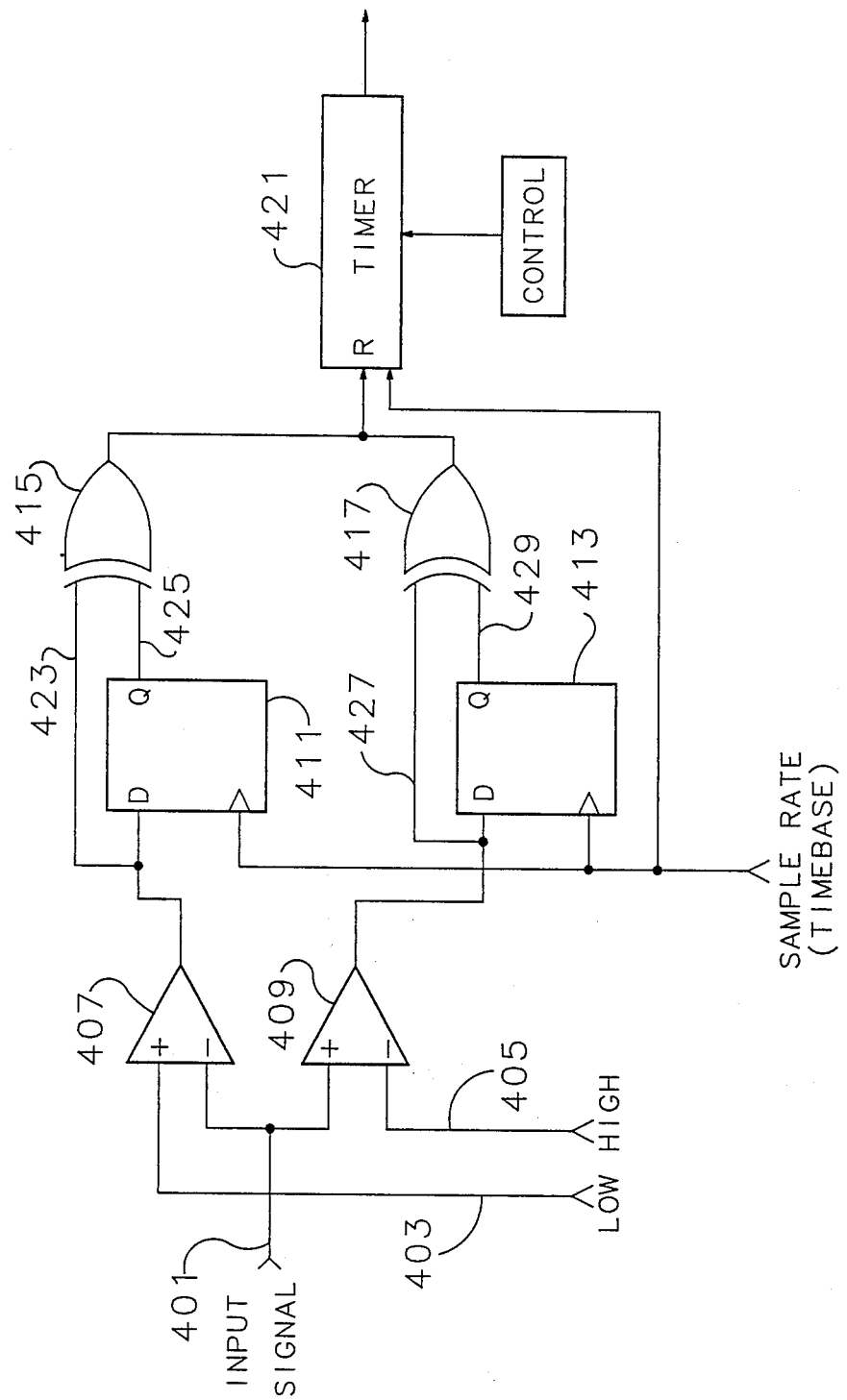
FIG. 4 is a schematic diagram of an alternative embodiment of a trigger circuit in accordance with the invention.

FIG. 4 shows an alternative embodiment for the drop out trigger adapted for analog input signals. In this embodiment, the drop out trigger is configured to produce an output signal when the input signal crosses either of two programmable threshold in either direction. Like the first embodiment, if the programmed trigger event does not occur for an interval that is longer than the alarm count interval programmed into the timer, the drop-out trigger will produce a "trigger occurred" signal.

The analog input signal is applied to the inverting input of comparator 407 and to the noninverting input of comparator 409. A programmable low threshold voltage is applied to the noninverting input of comparator 407. A programmable high threshold voltage is applied to the inverting input of comparator 409. The output of comparator 407 is applied to the D input of D flip-flop 411 and to one input of exclusive or gate 415. The Q output of flip-flop 411 is applied to the other input of exclusive or gate 415. Similarly, the output of comparator 409 is applied to the D input of D flip-flop 413 and to one input of or gate 417. The Q output of flip-flop 413 is applied to the other input of or gate 417. The outputs of both or gates 415 and 417 are connected to the reset terminal of timer 421. The sample rate clock signal from timebase 20 is applied to the clock inputs of flip-flops 411 and 413, and to timer 421.

Figure 5:
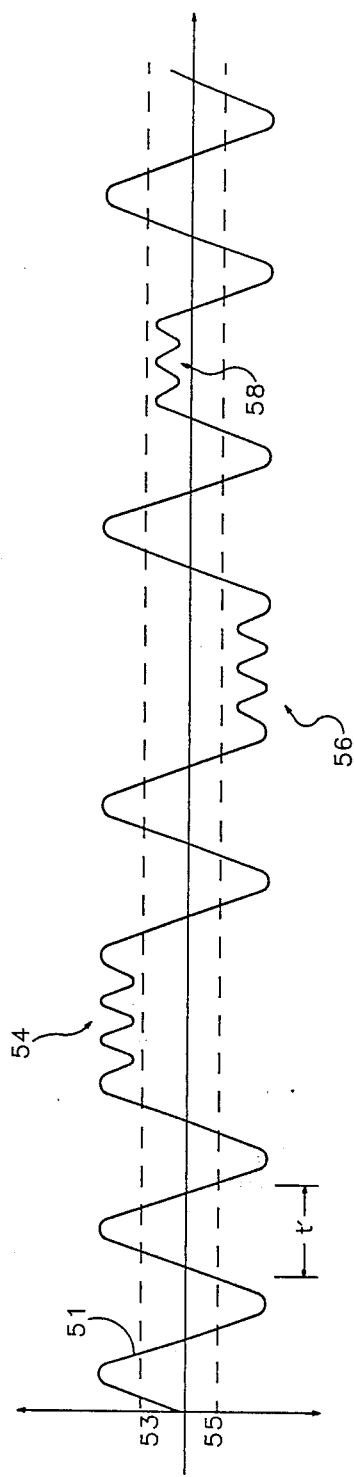
FIG. 5 is a graph of a waveform illustrating the operation of the trigger circuit of FIG. 4.

The operation of the drop-out trigger of FIG. 4 is illustrated in FIG. 5. The trigger is configured to capture data if the input signal 51 does not cross either the high threshold 53 or the low threshold 55 for a predetermined interval.

Each time the input signal 51 passes through the low threshold 55 the output of comparator 407 will change sign. This makes the input to the exclusive or gate on line 423 different from the one on line 425, and the exclusive or gate 415 turns on producing a reset pulse for timer 421. On the next clock pulse, flip-flop 411 switches its Q output to the same state as its D input, and exclusive or gate 415 turns off. Similarly, each time the input signal passes through the high threshold 53, the output of comparator 409 changes state, and exclusive or gate 417 produces a reset pulse for timer 421.

If the alarm count of timer 421 is set slightly longer than the longest expected interval between threshold crossings, e.g., t' as shown in FIG. 5, the timer will be reset as long as the input signal behaves normally, and the drop out trigger will not produce a measurement signal.

However, if input signal 51 remains above the high threshold, as at 54, below the low threshold, as at 56, or between the thresholds, as at 58, longer than the alarm count interval programmed into the counter 421, the drop-out trigger will produce a measurement signal.

This triggering mode is particularly useful in finding out how an oscillator or clock signal is gated off, or in capturing instances of random missing pulses.

What is claimed is:

1. A triggering circuit responsive to the disruption of a normally continuous input signal to produce a measurement signal output, comprising:
   timer means having an adjustable alarm count and a reset input, producing a measurement signal output if the alarm count is reached;
   control means for programming the alarm count of the timer means at a value larger than the periodic interval at which the continuous input signal satisfies a predetermined condition;
   means responsive to the input signal, connected to the reset input of the timer, for producing a reset signal when the input signal satisfies the predetermined condition.

2. A method for detecting and recording the disruption of a normally continuous input signal, comprising the steps of:
   monitoring the input signal to determine when the input signal satisfies a predetermined condition characteristic of the periodic cycle of the continuous signal;

producing a trigger signal, indicating the normal behavior of the input signal, whenever the input signal satisfies the predetermined condition;

timing the interval from the occurrence of each trigger signal;

producing a measurement signal, indicating the disruption of the input signal, if the timed interval exceeds the periodic interval at which the continuous signal satisfies the predetermined condition;

storing the input signal in a memory when a measurement signal occurs.

* * * * *